United States Patent [19]

Engeler et al.

[11] 4,032,867

[45] June 28, 1977

[54] BALANCED TRANSVERSAL FILTER

[75] Inventors: William E. Engeler; Richard D. Baertsch, both of Scotia, N.Y.

[73] Assignee: General Electric Company, Schenectady, N.Y.

[22] Filed: Sept. 2, 1975

[21] Appl. No.: 609,415

[52] U.S. Cl. .............................. 333/70 T; 307/208; 307/221 D; 357/24
[51] Int. Cl.[2] .................. H03H 7/28; H03K 5/159; H01L 29/78; H01L 27/10
[58] Field of Search .............. 333/70 T; 307/221 R, 307/221 C, 221 D, 208; 357/24; 328/167

[56] References Cited

UNITED STATES PATENTS 3,819,958  6/1974  Gosney ........................ 333/70 T X

OTHER PUBLICATIONS

MacLennan, "Charge Coupled Devices"; Wireless World, Feb. 1975, pp. 61–65.
Ibrahim et al., "CCD'S for Transversal Filter Applications"; IEEE IEDM, Washington, D. C., Dec. 1974, cover page & pp. 240–243.
Sangster, "The Bucket Brigade Delay Line, A Shift Register for Analogue Signals"; Phillips Technical Review, vol. 31, 1970, No. 4, pp. 97–110.

Primary Examiner—Paul L. Gensler
Assistant Examiner—Marvin Nussbaum
Attorney, Agent, or Firm—Julius J. Zaskalicky; Joseph T. Cohen; Jerome C. Squillaro

[57] ABSTRACT

In a charge transfer transversal filter a semiconductor substrate is provided with main and parallel portions. A group of serially arranged electrodes insulatingly overlie and are uniformly spaced from the channel portions. The electrodes form with the substrate a plurality of stages of first and second charge transfer shift register over the main and parallel channel portions of the substrate, respectively. One electrode of each of the stages of the shift registers has a split along the length dimension thereof over the main channel portion dividing each of the one electrodes over the main channel portion into a first part and a second part with a third part overlying the parallel channel portion. The first parts of the one electrodes are connected to a first conductive line and the second and third parts of the one electrodes are connected to a second conductive line. The area of the first parts of the one electrodes being equal to the sum of the areas of the second and third parts of the one electrode.

8 Claims, 12 Drawing Figures

BALANCED TRANSVERSAL FILTER

The present invention relates to charge transfer transversal filters in which split electrodes are utilized to provide weighting in the various stages thereof.

A surface charge transversal filter comprises a serial organization of N stages of closely coupled MOS (Metal-Oxide-Semiconductor) capacitors. Charge packets representing sequential samples of an analog signal are serially inserted into the filter and are clocked at a rate $f_c = 1/T_c$ per sec, where $T_c$ is the period of the sampling along the N stages of the filter. A charge packet emerges from the last stage $NT_c$ seconds after introduction or insertion into the filter. The filter includes means for non-destructively measuring and weighting the signal samples at each of the stages and for obtaining a sum of the N weighted samples.

The weighting of the signal samples simultaneously in all stages is achieved by setting the value of the capacitors on which the signal samples are stored according to the desired tap weights. Tap weights are implemented in each of the stages by splitting the commonly phased electrodes of the capacitors of the stages into a A side or part and a B side or part. The A sides of the electrodes are connected together and to a first commonly phased line, and also the B sides of the electrodes are connected together and to a second commonly phased line. An electrode with a split at the center corresponds to a tap weight of zero. An electrode split such that the active portions of the electrode is connected only to the first phased line corresponds to a tap weight of +1. An electrode split such that the active portion of the electrode is connected only to the second commonly phased line corresponds to a tap weight of −1. An electrode split at an intermediate point would provide a corresponding intermediate tap weight.

With such a means for providing tap weights in order to obtain a sum of the weighted samples, the negatively weighted samples are summed on the first line and the positively weighted samples are summed on the second line. A differential amplifier connected to the first and second lines is utilized to obtain the net sum. Thus, a surface charge transversal filter such as described above generates an output signal $S_{out}(t)$ which is the convolution of N samples of an input signal $S_{in}(t)$ with a set of N weighting factors $W_n$. The foregoing statement may be expressed mathematically as follows:

$$S_{out}(t) = \sum_{n=1}^{N} W_n S_{in}(t - nT_c). \quad (1)$$

The filter response is determined entirely by the choice of the set of N tap weights $W_n(n=1,N)$. If a particular response is desired, it may be approximated by choosing the N tap weights appropriately. In general the tap weights so chosen often result in the total capacitance on the A side being different from the total capacitance on the B side. To provide an accurate net sum of the induced signals on the two lines the total capacitance of the A side of the split electrodes must be the same as the total capacitance of the B sides of the split electrodes. The balance in capacitances can be provided by the addition of a fixed external capacitance on the side with smaller capacitance. Such an added fixed capacitance does not capacitively balance two sides of the electrodes under all operating conditions. This is primarily because the capacitances of the A and the B sides depend on the level of background charge. Additionally, components of the clocking signals are capacitively coupled to the weighting electrodes from the other electrodes of the filter and alter the signals appearing on the lines connected to A and B sides of the electrodes. With the total area of the A and B electrodes being unequal, the unwanted coupling is unbalanced and may not be easily cancelled by external added capacitance.

The present invention is directed to the provision of means in a split electrode transversal filter for providing an exact capacitive balance between the two sides of the split electrode system under varying conditions of operation, thereby to overcome problems such as mentioned above and improve the overall operation of the filter.

An object of the present invention is to provide improvements in surface charge transversal filters.

Another object of the present invention is to provide means for obtaining a balanced output for a charge transfer transversal filter having a non zero tap weight sum.

In carrying out the invention in an illustrative embodiment there is provided a substance of one conductivity type semiconductor material including a first channel portion of uniform width adjacent a major surface of the substrate and a second channel portion adjacent the major surface of the substrate parallel to the first channel portion and of uniform width. An insulator member overlies the major surface and has uniform thickness over the first and second channel portions. A group of serially arranged electrodes are provided on the insulating member, overlying the channel portions and orthogonal to the length thereof. The electrodes are of uniform length measured along the length dimension of the channels. The electrodes form with the substrate a plurality of stages of a first charge coupled shift register over the first channel portion and a like plurality of stages of a second charge coupled shift register over the second channel portion, each stage of each of the shift registers including a like member of electrodes. One electrode of each of the stages of the shift registers has a split along the length dimension thereof over the first channel portion to divide the one electrode over the first channel portion into a first part and a second part. A third part of the one electrode of each stage overlies the second channel portion. The position of the split with respect to the center of the channel in a stage represents the weighting $W_n$ of that stage. Each of the one conductor members of the stages being identically situated in its respective stage. A first conductive line is connected to the first parts of the one electrode of the stages. A second conductive line is connected to the second and third parts of the electrodes. The sum of the areas of the first parts of the one electrode of the stages are equal to the sum of the areas of the second and third parts of the one electrodes.

The features which are believed to be characteristic of the present invention are set forth with particularity in the appended claims. The invention itself, both as to its organization and method of operation, together with further objects and advantages thereof may best be understood by reference to the following description taken in connection in the accompanying drawings wherein:

FIG. 6b is another diagram of semiconductor surface potential versus distance along the semiconductor surface at another point in time in the cycle of charge transfer from stage to stage of the structure of FIG. 6a.

FIGS. 8b and 8c are diagrams of semiconductor surface potential versus distance along the semiconductor surface at other points in time in the cycle of forming a packet of charge for insertion into the shift register of FIG. 8a.

Figure 1:
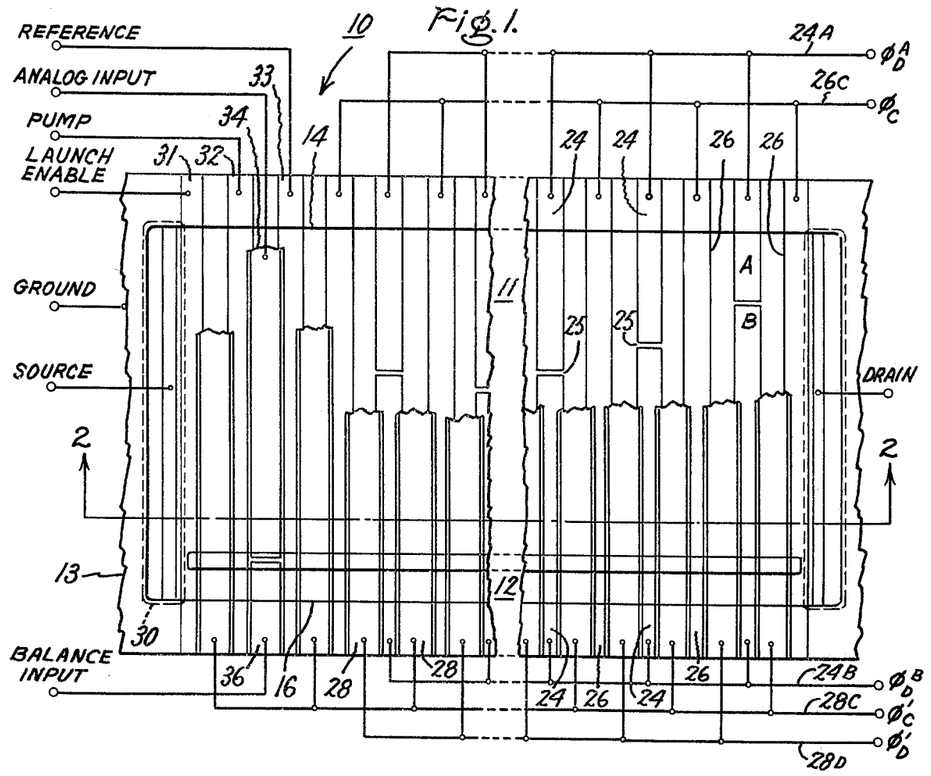
FIG. 1 shows a plan view of a transversal filter in accordance with the present invention.
Figure 2:
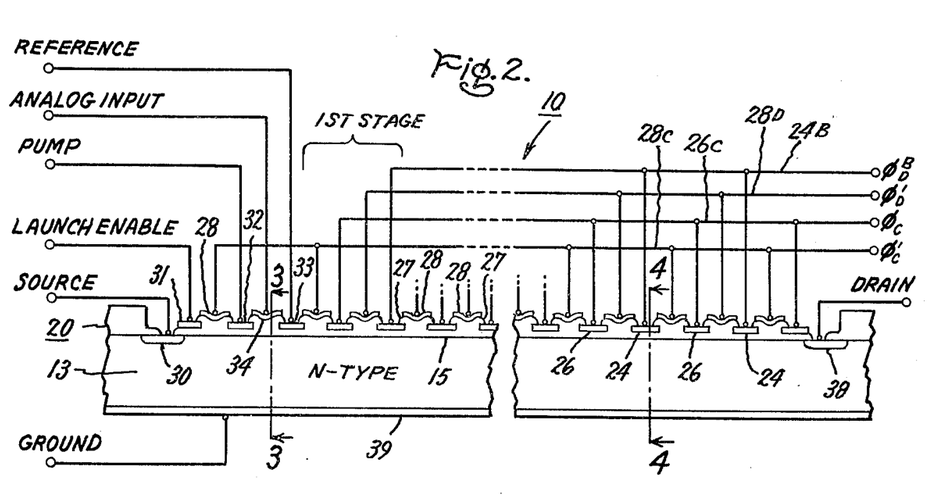
FIG. 2 is a sectional view of the embodiment of FIG. 1 taken along sectional lines 2—2 of FIG. 1.

Reference is now made to FIGS. 1 and 2 which show a transversal filter embodying the present invention. The transversal filter 10 includes a main or first surface charge transfer shift register 11 and a second or parallel surface charge transfer shift register 12. The shift registers are formed on a semiconductor substrate 13 of N-type conductivity which has a first channel portion 14 of uniform width adjacent a major surface 15 of the substrate and also includes a second channel portion 16 adjacent the major surface parallel to the first channel portion and also of uniform width best seen in FIGS. 3 and 4. Typically the substrate may be silicon semiconductor material of 4 ohm-cm resistivity. Overlying the major surface of the substrate 13 is a thick insulating member 20 of silicon dioxide having a pair of thin portions. A first thin portion 21 is of generally rectangular outline and lies in registry with the first channel portion 14 of the substrate. A second thin portion 22 is also of generally rectangular outline and lies in registry with the second channel portion 16 of the substrate. A first plurality of electrodes 24 are provided on the insulating member 20 overlying the thin portions 21 and 22 thereof and orthogonal to the length thereof. Each of the electrodes 24 is of uniform length in the direction of the length of the semiconductor channel portions 14 and 16 and each of the electrodes 24 extends across both of the thin insulating portions 21 and 22 of the insulating member as well as over the bordering thick insulation portions of the insulating member 20. Each of the electrodes 24 of the first plurality has a split or gap 25 across the short dimension thereof over the first channel portion which divides the electrode into a first or A part and a second or B part. A third part of each of the electrodes overlies the second channel portion.

The gap or split 25 in each of the electrodes 24 is small to allow the depletion regions or potential wells under the A and B parts to be coupled together efficiently to enable charge transferred to two potential wells under each electrode 24 to equilibrate, i.e. divide in accordance with the relative area of the A and B parts. Preferably, regions of P-type condictivity are provided underlying each of the gaps 25 to enable the conduction of charge between adjacent potential wells of a split electrode 24 of the shift register, as is more fully described and claimed in a copending application Ser. No. 609,414 filed Sept. 2, 1975 and assigned to the assignee of the present invention. The aforementioned application 609,414 is incorporated herein by reference thereto.

A second plurality of electrodes 26 which are unsplit are provided on the insulating member 20 overlying the thin portions 21 and 22 thereof and orthogonal to the length thereof. Each of the electrodes 26 is of uniform length in the direction of the length of the channel portions 14 and 16 and equal to the uniform length of each of the electrodes 24 of the first plurality. Each of the electrodes 26 of the second plurality are spaced between adjacent electrodes 24 of the first plurality and each extends completely over both of the thin insulating portions of the insulating member 20 as well as the bordering thick insulation portions of the insulating member 20. An insulating layer 27 is provided over the electrodes 24 and 26 of the first and second plurality. A plurality of transfer electrodes 28 are provided over the insulating layer 27, each of the transfer electrodes being insulatingly spaced between adjacent electrodes of the first and second pluralities and overlying the adjacent members thereof. Each of the transfer electrodes 28 is of substantially uniform extent in the direction of the length of the channel portions and extends entirely over the thin insulating portions of the insulating member 20 as well as the bordering thick insulating portions thereof. The manner in which charge is transferred in the shift registers will be explained below in connection with FIGS. 6a and 6b.

Figure 8A:
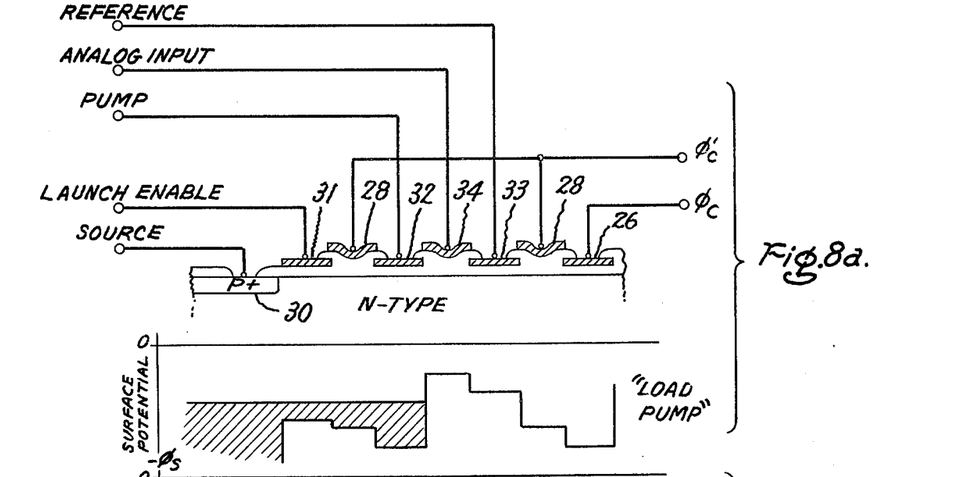
FIG. 8a is a sectional view of the charge input or insertion structure of the main shift register of the apparatus of FIG. 1 including a diagram of semiconductor surface potential versus distance along the semiconductor surface useful in explaining the manner in which charge is inserted or introduced into the shift register.

Also provided in the embodiment of FIGS. 1 and 2, and also shown in FIG. 8a, is apparatus for serially forming and inserting or introducing packets of charge into the first stage of the main shift register and also into the first stage of the parallel shift register for transfer from stage to stage in synchronism with the clocking voltages applied to the electrodes of the shift registers. The packets of charge introduced into the main shift register represent samples of the applied analog signal. Each packet of charge is related to the difference between the analog input voltage and a zero level bias voltage. This permits both positive and negative excursions of the analog input signal. The packets of charge introduced into the parallel shift register represent a level of charge equal to the level of charge introduced into the main shift register at zero signal. The charge input apparatus includes a source of charge in the form of a P-type conductivity region 30 of elongated configuration orthogonally disposed with respect to the length of channel portions 14 and 16 of the substrate and located at the left-handed end thereof. Overlying the main and parallel channel portions 14 and 16, extending entirely across the width thereof and identical in configuration to the second plurality of conductor members 26 are provided a launch-enable electrode 31, a pump electrode 32 and a reference electrode 33 arranged serially in the order recited between the P-type source 30 and the first stage of both of the main and parallel shift registers 11 and 12. The launch-enable electrode 31 overlaps a portion of the P-type source 30. The launch-enable electrode 31 performs launching and enabling functions for the shift registers. A transfer electrode 28 is provided extending over the entire width of the two channels and overlying the launch-enable electrode 31 and the pump electrode 32. An analog input electrode 34 is provided identical in form to a transfer electrode 28, insulatingly overlying the pump electrode 32 and the reference electrode 33 and extending over only the first channel portion 16 of the substrate 13, as shown. A balance input electrode 36 is provided identical in form to a transfer electrode 28 insulatingly overlying the pump electrode 32 and reference electrode 33 and extending over only the second channel portion 16 of the substrate 13, as shown. The manner in which the various electrodes of the charge input apparatus are biased and operationally function to provide charge packets to the stages of the shift registers in accordance with the present invention will be explained below in connection with FIGS. 8a, 8b and 8c.

There is also provided in the embodiment of FIGS. 1 and 2 apparatus for removing charge after it is passed through the shift registers. To this end there is provided an elongated region of P-type conductivity or drain 38 at the right-handed end of the channel portions 14 and 16. The drain 38 is of elongated configuration with its long dimension parallel to the width dimension of the channel portions 14 and 16. The electrode 26 of the last stages of the main and parallel shift registers partially overlaps the drain 38. A conductive layer 39 of a suitable material such as aluminum is bonded to the lower surface of the substrate 13 to provide a ground connection for the filter.

While in FIG. 2, a section of the filter taken along section line 2—2 of FIG. 1, shows the structure of the main channel, the structure of the parallel second shift register in section would be the same as shown in FIG. 2.

Figure 3:
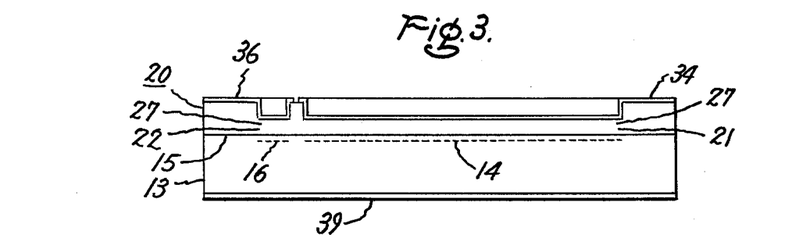
FIG. 3 is a sectional view of the apparatus of FIGS. 1 and 2 taken along sectional lines 3—3 of FIG. 2.

FIG. 3 shows a sectional view of the transversal filter of FIGS. 1 and 2 taken along section lines 3—3 of FIG. 2. FIG. 3 shows the manner in which a transfer electrode is split having a portion 34 designated analog input which overlies the first channel 14 for controlling charge input to the first shift register, as will be explained more fully below in FIGS. 8a, 8b and 8c, in connection with the operation of the charge input apparatus. A second portion 36 designated balance input overlies the second channel portion for similarly controlling charge input to the second shift register.

Figure 4:
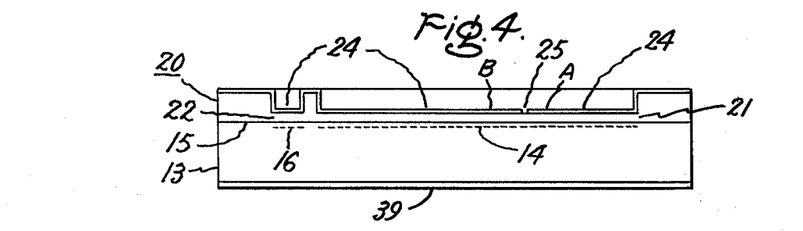
FIG. 4 is a sectional view of the apparatus of FIG. 2 taken along sectional lines 4—4 of FIG. 2.

FIG. 4 shows a sectional view of the transversal filter of FIGS. 1 and 2 taken along section lines 4—4 of FIG. 2. In particular, this figure shows a split conductor 24 of the first plurality to which clock voltages $\phi_D$ are applied as will be more fully explained in connection with FIGS. 6a–6c, and 7. FIG. 4 shows the split or gap 25 in the conductor member overlying the first channel portion 14 into a first or A part and a second or B part separated from it by the gap 25.

Figure 5:
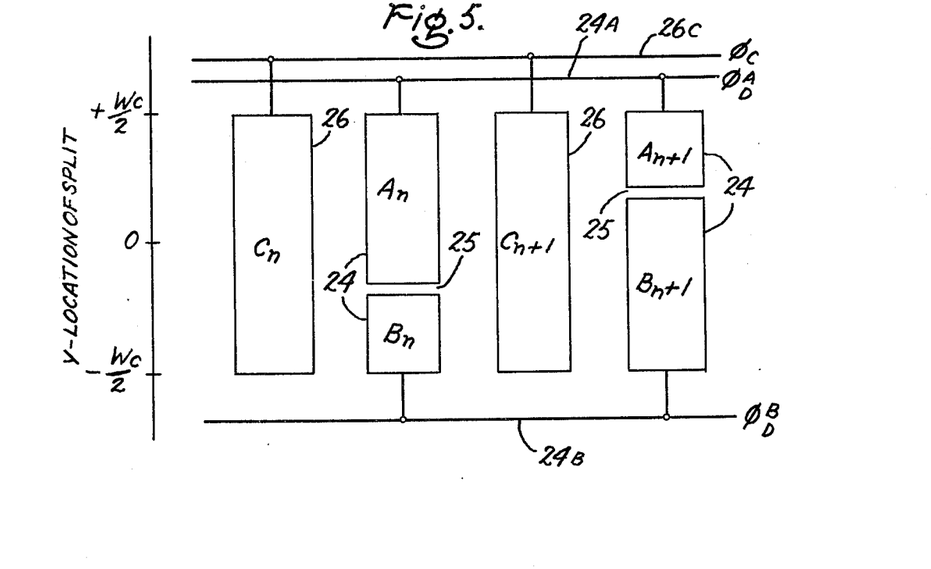
FIG. 5 is a diagram of some of the storage and transfer electrodes of the embodiment of FIG. 1 useful in explaining the manner of providing weighting of signal samples in the states of the transversal filter.

In the drawings of FIGS. 1 and 5, the upper parts of the electrodes 24 of the first plurality overlying the first channel portion 14 are designated as the first or A parts and the lower parts of the electrode 24 overlying the first channel portion and spaced by the gap 25 from the first parts thereof are designated the second or B parts of the electrodes. The parts of the electrodes 24 overlying the second channel portion 16 of the substrate are designated the third parts of the electrodes 24. Each of the electrodes 24 of the first plurality are weighted by the positioning of the gap or split 25 therein between the ends thereof in the first channel portion, as illustrated in FIG. 5.

In FIG. 5 are shown two successive electrodes 24 of the first plurality with splits in them and two successive electrodes 26 of the second plurality without splits in them. The weighting of an electrode is determined by the relative areas of the A and B sides or segments of the electrode. The ratio of the areas of the A and B portions of the $n^{th}$ split electrode or tap are related to the tap weight $W_n$ as follows:

$$\frac{A_n}{B_n} = \frac{\frac{1}{2}(1 + W_n)}{\frac{1}{2}(1 - W_n)}, \tag{2}$$

where tap weights have been normalized so that $-1 \leq W_n \leq +1$. Thus, with the split at the center of the electrode 24, the area $A_n$ and the area $B_n$ thereof are equal and the tap weight is zero. With no split and the electrode 24 connected to line 24B, i.e. when $W_n = -1-$, then $A_n = 0$, and conversely with the electrode 24 connected to line 24A, i.e. when $W_n = +1$, then $B_n = 0$. Location of the gap or split for a desired tap weight between $-1$ and 1 is defined by the relationship $$Y = -\tfrac{1}{2} w_c W_n. \tag{3}$$

where $w_c$ is the width of the main channel electrode 24.

The position Y of the gaps (and also weighting $W_n$) will vary in some predetermined relationship with respect to stage number $n$, i.e. $W_n = f(n)$, to obtain the desired output response from the filter. Usually, the splits in the electrodes result in total capacitances of the A and B sides being unequal. For example, in a matched low pass filter the weighting (and also the splits) as a function of stage number is as follows:

$$W_n = K \left[ \frac{\sin\left(\frac{2\pi}{M}\left[n - \left(\frac{N-1}{2}\right)\right]\right)}{\frac{2\pi}{M}\left[n - \left(\frac{N-1}{2}\right)\right]} \right], \tag{4}$$

where $N$ is the number of taps or stages, $M$ is a constant which relates to the cut-off frequency of the filter, and $K$ is a constant of proportionality. In the low pass filter of equation 4, the capacitance on one of the sides of the split electrodes is less than the capacitance on the other side of the split electrodes. In order to obtain a proper sensing and summation of the charge clocked in the shift register at each cycle of operation, it is essential for the capacitance on the two sides of the split electrodes of the shift register to be equal, i.e. that the capacitance of the electrode system of line 24A equal the capacitance of the electrode system of line 24B. This result may be achieved by an externally connected capacitance. However, as the zero signal level operating conditions of the shift register change, such fixed externally connected capacitance cannot balance the shift register for all conditions. This results from the various time constants and capacitances associated with charge transfer shift registers. In this connection it should be noted that the dynamic capacitance of the electrodes to the substrate is dependent on the voltages on the electrodes. Additionally, the externally added capacitance may not balance unequal clocking voltage pick up on the split electrodes due to unequal capacitive coupling thereto of the clocking electrodes.

Figure 9:
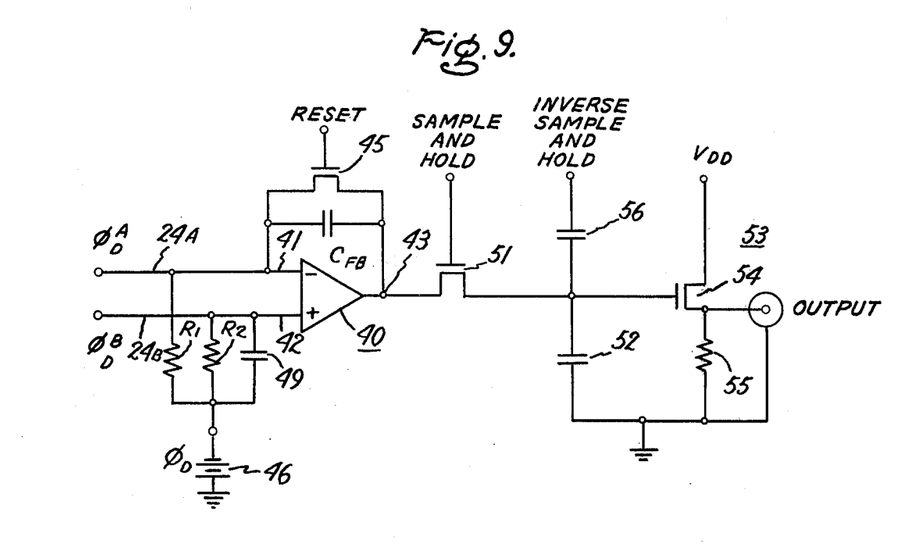
FIG. 9 is a schematic diagram of a signal output circuit for use with the transversal filter structure of FIG. 1.

In accordance with the present invention such short comings in the operation of conventional split electrode transversal filters are remedied by providing the second or parallel shift register 12 formed and connected to the main shift register 11, as described above. With the width of the second or parallel channel 12 set in accordance with the relationship $$w = w_c \frac{\sum_{n=1}^{N} W_n}{N}, \quad (5)$$

where $w_c$ is the width of the main channel electrodes 24 and $W_n$ is the weighting of the $n^{th}$ stage, a charge equal to the zero signal charge of the main channel times $w/w_c$ is transferred at each clock cycle into the parallel channel. This is accomplished by maintaining the balance input electrode 36 of the second channel at a voltage substantially equal to the zero signal input voltage applied to the analog input electrode 34 of the main channel. By maintaining the second channel charge at this level insurance is provided that the average transient behavior of the capacitance of the electrodes connected to line 24A is the same average transient behavior of the capacitance connected to line 24B. Thus, capacitances on lines 24A and 24B are dynamically balanced under all conditions of operation. Also, the filter is balanced for clocking electrode pick up, as each side of the split or output electrodes is identically capacitively coupled to adjacent clocking electrodes, as will be explained more fully in connection with FIG. 9.

Figure 7:
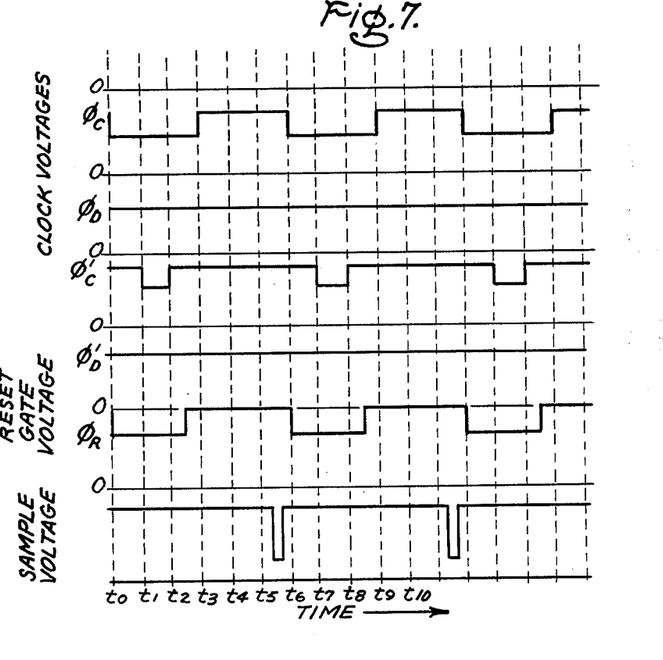
FIG. 7 is a diagram of voltage waveforms useful in explaining the operation of the transversal filter of the present invention.

Referring now to FIGS. 1 and 2, all of the A or first parts of the electrodes 24 of the first plurality are connected to a common line 24A to which a $\phi_D$ voltage, designated $\phi_D{}^A$, is applied through the circuit of FIG. 9. All of the B or second parts of the electrodes 24 of the first plurality are connected to a common line 24B to which a $\phi_D$ voltage designated $\phi_D{}^B$ is applied through the circuit of FIG. 9. The manner of application of the $\phi_D$ voltage will be explained in connection with FIG. 9. Also, of course, the third parts of the electrodes of the first plurality are also connected to the line 24B as they are integral therewith as explained above. All of the second plurality of electrodes 26 are connected to a common line 26C to which a voltage $\phi_C$ is applied such as shown in FIG. 7. All of the transfer electrodes 28 immediately preceding the split electrodes 24, that is on the input side thereof, are connected to a common line 28D. All of the transfer electrodes 28 located on the output side of the conductor members of the first plurality are connected to a common line and terminal 28C. As pointed out above when a weighting of $a + 1$ or $a - 1$ is desired the entire portion of electrode 24 overlying the channel portion 14 is connected either to line 24A or 24B. These two tap weights of +1 or −1 are implemented by providing a split in electrode 24 at the appropriate boundary between thin and thick oxide layers. To maintain balance of capacitances on the lines 24A and 24B, the portions of conductors 24 overlying the thick oxide which is uppermost in FIG. 1 and hence connected to line 24A is equal to the portions of electrodes 24B overlying the lower thick oxide of insulating layer 20 plus the portions of electrodes 24B overlying the intermediate thick oxide of insulating layer 20 separating the channel portions 14 and 16 of the main and parallel shift registers. These provisions are for the purpose of balancing the capacitances of electrodes 24 connected to lines 24A and 24B which overlie the thick oxide (both the capacitances of electrodes 24 to substrate and the capacitances of electrodes 24 to electrodes 28).

Figure 6A:
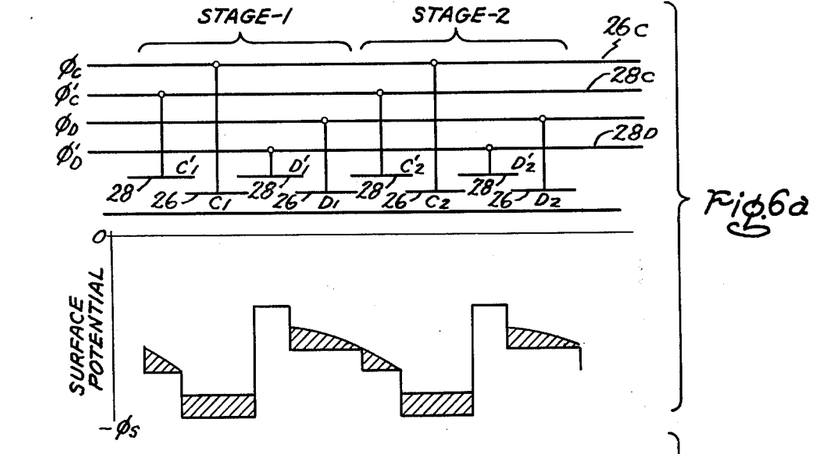
FIG. 6a shows a sectional view of two stages of the main shift register of the transversal filter of FIG. 1 and also includes a diagram of semiconductor surface potential versus distance along the semiconductor surface useful in explaining one mode in which charge is transferred from one stage to another stage.
Figure 6B:
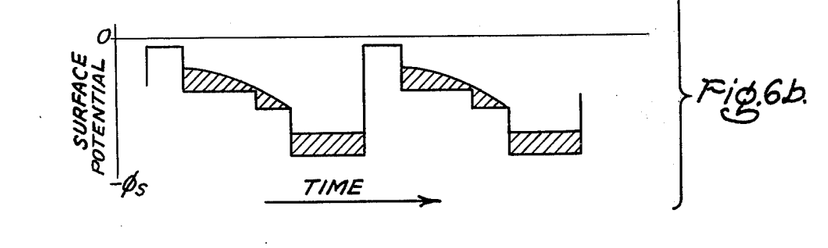

The manner in which packets of charge are transferred from stage to stage along the shift registers of FIGS. 1 and 2 is illustrated in connection with FIGS. 6a and 6b and the timing wave form diagrams of FIG. 7. In FIG. 6a is shown the first two stages of a shift register which may represent either the main or first shift register 11 or the parallel or second shift register 12, referred to above. Each stage includes an electrode C, an electrode C', an electrode D and an electrode D', each connected to their respective $\phi_C$, $\phi_C{}'$, $\phi_D$ and $\phi_D{}'$ supply lines. The voltages $\phi_C$, $\phi_C{}'$, $\phi_D$, and $\phi_D{}'$ applied to the lines are shown in FIG. 7. For the structure shown utilizing a silicon substrate of N-type conductivity and having a resistivity of about 4 ohm-cm, an oxide thickness under the C and D electrodes of 1000 Angstroms and an oxide thickness under the C' and D' electrodes of 2000 Angstroms, typical relative values of voltage which may be used and the waveform thereof are depicted in FIG. 7. For example, the $\phi_C$ voltage levels are −6 volts and −28 volts, the $\phi_C{}'$ voltage levels are −3 volts and −22 volts. The $\phi_D$ voltage is a fixed voltage lying between the extreme values of the $\phi_C$ voltage and is shown as about −15 volts. The $\phi_D{}'$ voltage is a fixed voltage lying between the extreme values of the $\phi_C{}'$ voltage and is shown as about −9 volts. It should be noted that in connection with FIG. 1 the voltage $\phi_D$ is applied to A and B parts of the split electrodes 24 through the circuit of FIG. 9.

The diagram of FIG. 6a shows variation in surface potential of the substrate at a point in time between $t_1$ and $t_2$ in the diagram of FIG. 7 with the various operating voltages $\phi_C$, $\phi_C{}'$, and $\phi_D$ and $\phi_D{}'$ applied to the clock lines. Packets of charge had been previously introduced into the potential well underlying the D electrodes. This is shown as a fixed quantity of charge for both of the potential wells underlying both of the $D_1$ and $D_2$ storage electrodes. At a point in time between $t_3$ and $t_4$ the voltage applied to the $\phi_C$ and the $\phi_C{}'$ clock lines has decreased. Thus, the surface potentials of the storage regions underlying the $C_1$ and $C_2$ electrodes have been raised to a value above the surface potential underlying the $D_1$ and $D_2$ electrodes which are maintained at a constant value. Also, the surface potentials of the storage regions underlying the $C_1{}'$ and $C_2{}'$ electrodes have been raised to a value above the surface potential of the $D_1{}'$ and $D_2{}'$ electrodes which are maintained at a constant value. Accordingly, the charge in the potential well underlying electrode $C_1$ flows into the potential well underlying electrode $D_1$ as illustrated in FIG. 6b, and also the charge in the potential well underlying electrode $C_2$ flows into the potential well underlying electrode $D_2$, as also illustrated in FIG. 6b. In order to assure transfer of charge in the C potential wells to the D potential wells, the voltage $\phi_C{}'$ is raised a short time earlier than the time of the rise in $\phi_C$ voltage thereby establishing a barrier to the flow of charge in a direction opposite to the desired direction, i.e. the desired direction being from left to right in FIGS. 6a and 6b. The shift registers of FIGS. 1 and 2, utilizing split electrodes which are maintained at a substantially fixed potential is particularly described and claimed in copending application Ser. No. 609,416 Sept. 2, 1975 and assigned to assignee of the present invention. The aforementioned application Ser. No. 609,416 is incorporated herein by reference thereto.

Figure 8B:
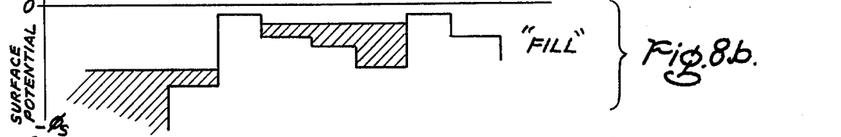
Figure 8C:
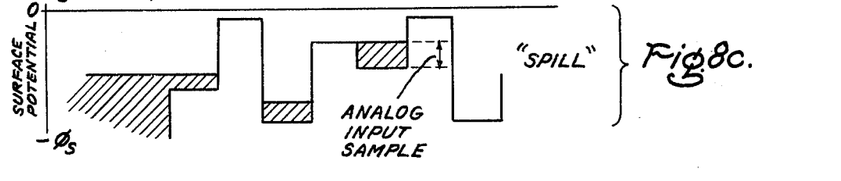

The manner in which the charge is supplied to the first stage of the shift registers of FIGS. 2 and 6a is shown in FIGS. 8a, 8b and 8c. FIG. 8a shows a portion of the drawing of FIG. 2 depicting the input apparatus of the main shift register including one-half of the first stage including the $C_1$ and the $C_1'$ electrodes of FIG. 6. The parts of the apparatus of this figure identical to the parts of the apparatus of FIG. 2 are identically designated. FIGS. 8a, 8b and 8c show the potential existing at the surface of the semiconductor substrate as a function of distance along the surface at respective successive intervals of time upon application of voltages of the form shown in FIG. 7 to the overlying electrodes to illustrate the manner in which a fixed quantity or packet of charge representing an analog sample of an applied signal is provided to the first stage of the main shift register. FIG. 8a illustrates the surface potential conditions existing at a point in time between $t_1$ and $t_2$ in FIG. 7. A suitable potential is applied to the source electrode 30 and to the launch-enable electrode 31 to introduce charge into the potential well formed underneath the pump electrode 32 to which a $\phi_P$ voltage (not specifically shown) is applied. The pump voltage $\phi_P$ is identical in form to the $\phi_C$ voltage except the least negative of the two extreme values thereof is more negative than the corresponding extreme value of $\phi_C$, i.e. $\phi_P$ is $-15$ volts, while $\phi_C$ is $-6$ volts. In FIG. 8a, both the pump voltage $\phi_P$ and the voltage $\phi_C'$ applied to electrode 28 adjacent the launch electrode are at their most negative values. Accordingly, charge carriers flow from the source region 30 through the channel underlying the launch-enable electrode 31 to the storage region underlying the pump electrode 32. The source 30 must be set at a potential sufficiently negative so that the flow of charge along the shift register is blocked by the level of voltage on the analog input electrode 34 but not so negative that it is always blocked by the region below the $\phi_C'$ electrodes 28 or the launch-enable electrode 31. The charge underlying the pump electrode 32 is then pumped to a more positive surface voltage as illustrated in FIG. 8b in the time interval $t_3-t_6$. This action permits charge to be transferred beyond the analog electrode 34 and into the storage region below the reference electrode 33. Note that in the time $t_3-t_6$, the volage $\phi_C'$ is at its least negative value and accordingly the surface potentials under electrodes 28 are at their least negative value. The action illustrated in FIG. 8b is referred to as the "fill" step of the input cycle. The next step of the input cycle is illustrated in FIG. 8c and corresponds to a time between $t_6$ and $t_7$. During this time the voltage on the pump electrode 32 has been dropped and excess charge is transferred back to the storage region underlying the pump electrode 32 until the surface potential of the region below the reference electrode 33 is equal to the surface potential underlying the analog input electrode 34. This action completes the "spill" portion of the cycle and leaves an amount of charge in the storage region under the reference electrode that is linearly proportional to the analog signal applied to the analog electrode 34. A bias level of one-half the maximum charge should be provided in the storage region under the reference electrode to permit operation with a.c. analog input signals. This bias charge also supplies the bias potential necessary for efficient charge transfer action in the presence of interface states. It should be noted that the "spill" portion of the cycle must precede the lowering of the $\phi_C'$ voltage by a time sufficient for equilibration to be established in the potential of the surface underlying the reference electrode 33 and in the potential of the surface underlying the analog input electrode 34. During the next change in voltage levels of the voltage $\phi_C'$ the analog input sample is transferred to the storage region underlying the $C_1$ electrode and thereafter is clocked along the shift register as explained in connection with FIGS. 6a, 6b and 6c. The input apparatus of the parallel shift register 12 having electrodes identical to the electrodes of the input apparatus of the main shift register, except for the balance input electrode 36, operates in the same way as the input apparatus of the main shift register except that only a bias voltage is applied to the balance input electrode 36 to provide a level of bias charge in the parallel channel corresponding to zero signal level in the main channel.

With respect to the main shift register input apparatus, as the quantity of charge introduced into the potential well underlying the reference electrode 33 is dependent on levels of voltage applied to the reference electrode 33 and to the analog input electrode 34, it is apparent that the voltage on electrode 34 could be held fixed and the voltage on the reference electrode varied. To implement this mode of operation the upper electrodes 34 and 36 would be connected together and the electrode 33 would be split at a point overlying the thick insulation between the main and parallel shift registers to provide separate electrodes, one of which would be the analog input electrode for the main shift register and the other of which would be the balance input electrode for the parallel shift register.

In FIG. 9 there is shown an output circuit for deriving an output which is the convolution of the samples of an analog input signal with a set of weighting factors ($W_n$) in the transversal filter of FIG. 1. To this end there is provided a high gain differential amplifier 40 having an inverting input terminal 41, a non-inverting input terminal 42 and an output terminal 43. The differential amplifier may be any of a variety of operational amplifiers commercially available, for example, operational amplifier LM318 available from National Semiconductor Company of Santa Clara, Calif. The inverting input terminal 41 is connected to the first line 24A interconnecting the A parts of the $\phi_D$ electrodes 24 of FIG. 1. The output terminal 43 is connected to the inverting input terminal 41 through a feedback capacitance $C_{FB}$. The potential of the inverting terminal 41 of the high gain differential amplifier 40 with capacitance feedback follows the potential of the non-inverting terminal 42 and delivers a voltage at the output terminal 43 which is proportional to the difference in induced charge on the first line 24A divided by the feedback capacitance $C_{FB}$. A reset switch 45 in the form of a MOSFET transistor is connected across the feedback capacitor $C_{FB}$. A source 46 of fixed voltage having its positive terminal connected to ground provides $\phi_D$ voltage. A first resistor $R_1$ connected between the negative terminal of source 46 of $\phi_D$ voltage and the first line 24A provides a resetting and isolation function with respect to the first line and the electrodes connected thereto. A second resistor $R_2$ connected between the negative terminal of source 46 of $\phi_D$ voltage and the second line 24B provides a resetting and isolation function with respect to the second line 24B. A capacitor 49 is connected between the non-inverting terminal 42 and the negative terminal of source 46. The capacitance 49 is equal to the capacitance of feedback capacitor $C_{FB}$ and is provided to maintain balance of capacitances on the two lines 24A to 24B to assure proper operation of the differential readout circuit. It has been pointed out above that in accordance with the present invention dynamic balance in the capacitances of the A and B parts of electrodes 24 of the first plurality connected, respectively, to the first line 24A and the second line 24B has been provided by the parallel shift register 12. It should be noted that output terminal 43 has a relatively low impedance with respective to ground and is essentially at A-C ground. Accordingly, as the total capacitance on the first line 24A is equal to the total capacitance on the second line 24B and the resistance $R_1$ and $R_2$ are equal, the time constants of the lines 24A and 24B are equal.

A sampling circuit is connected between output terminal 43 and ground and comprises a MOSFET transistor 51 connected in series with a sampling capacitor 52. The source to drain conduction path of the MOSFET transistor 51 is connected in series with the sampling capacitor 52. The gate electrode of the MOSFET transistor 51 is connected to a source of sampling pulses, such as shown in FIG. 7. The output appearing across the sampling capacitor 52 is applied to a source follower circuit 53 which includes a MOSFET transistor 54, the source to drain conduction path of which is connected in series between a source of operating potential $V_{DD}$ and ground through an output impedance 55. The sampling capacitor 52 is connected between the gate of transistor 54 and ground. A voltage waveform which is the inverse of the sample voltage waveform of FIG. 7 is applied to sampling capacitor 52 through coupling capacitor 56 to cancel feed through of the sample pulses applied to transistor 51.

The manner in which the circuit of FIG. 9 connected to the traversal filter of FIG. 1 derives an output which is a measure of the difference in charges induced on the A parts of electrodes 24 connected to line 24A and the B parts of electrodes 24 connected to line 24B in response to the transfer of charge to the storage regions lying thereunder will now be explained in connection with the waveform diagrams of FIG. 7. The $\phi_C$, $\phi_C'$ and $\phi_D'$ voltages are applied, respectively to lines 26C, 28C and 28D from suitable sources (not shown). The voltage $\phi_D$ is applied to the lines 24A and 24B from a source 46. Packets of charge representing signal samples are introduced at the input of the transversal filter 10 and are clocked along the surface from stage to stage of the filter as explained above in connection with FIGS. 8a–8c and 6a–6b. Typically, as mentioned above, for an oxide thickness under the $\phi_C$ and $\phi_D$ electrodes 24 and 26 of about 1000 Angstrom Units and an oxide thickness under the $\phi_C'$ and $\phi_D'$ electrodes 28 of about 2000 Angstrom Units, the voltage levels of the $\phi_C'$ waveform are −3 and −22 volts. The voltage level of $\phi_D$ and $\phi_D'$ are, respectively, −15 and −9 volts. During the interval $t_o$–$t_l$ with the transfer gate voltage $\phi_C'$ at its least negative value, no charge is transferred from the storage sites underlying the $\phi_D$ electrodes to the storage sites underlying the $\phi_C$ electrodes. During the interval $t_1$–$t_2$ with the $\phi_C$ voltage and the transfer gate voltage $\phi_C'$ at their most negative values, charge is transferred from the storage sites underlying the $\phi_D$ electrodes to the storage sites underlying the $\phi_C$ electrodes.

The reset switch 45 is closed from a time $t_o$ to a time somewhat after $t_2$, as seen from the reset waveform $\phi_R$ of FIG. 7 applied to the gate of transistor 45, and shorts out the feedback capacitor $C_{FB}$. During this interval the potential at the input terminal 41 is equal to the potential on the output terminal 43 and the potential on input terminal 42. The potential on terminals 41, 42 and 43 of the differential amplifier would be essentially the potential of the $\phi_D$ source 46 assuming induced charge on line 24B has decayed to zero. At instant $t_3$, the $\phi_C$ voltage goes to its least negative value and thereby enables charge to be transferred from $\phi_C$ storage sites to the $\phi_D$ storage sites. The reset switch 45 is opened somewhat before $t_3$, as the reset voltage $\phi_R$ goes to zero at that time. Charge transfer from the $\phi_C$ to the $\phi_D$ storage sites occurs during the interval $t_3$–$t_6$. When surface charge transfers from the $\phi_C$ to the $\phi_D$ sites, an opposing charge which is proportional to the transferred charge is induced in the $\phi_D$ lines 24A and 24B. As the capacitance of line 24A is the same as the capacitance of line 24B and as the lines are isolated from source 46 by resistors $R_1$ and $R_2$, respectively, the charge induces a voltage change on the lines proportional to the individual charges induced thereon. The interval of transfer of charge, i.e. $t_3$–$t_6$, is relatively short in comparison to the time constant of the total capacitance of the line 24A and resistance $R_1$ and in comparison to the time constant of the total capacitance of the line 24B and resistance $R_2$. As the high gain differential amplifier has capacitance feedback to the inverting terminal, the inverting input terminal 41 follows the potential of the non-inverting terminal 42. Thus, a difference in induced charge on the first and second lines causes the amplifier to deliver charge from the output terminal to the inverting input terminal through the feedback capacitance to maintain equal voltage on the input terminals. Accordingly the difference in charge induced on the lines may be represented by the change in voltage at the output terminal ($\Delta\epsilon_D$) times the feedback capacitance $C_{FB}$. With a differential amplifier with a fast slew rate, the new level of output voltage is reached rapidly. With the time constants of the lines 24A and 24B relatively long with respect to the charge transfer time, the amplifier can quickly develop an output which is a measure of the difference in induced charge on the lines 24A and 24B. Sampling the change in output level of voltage provides a measure of the sum of the weighted samples of the analog signal. The output voltage is sampled after the charge transfer has been completed and during the interval $t_5$–$t_6$ by energizing the MOSFET transistor 51 to charge the sampling capacitor 52 and thereby obtain a sample voltage which is a measure of the difference in charge delivered to the lines 24A and 24B. The sampled voltage is applied to the gate of the source follower 53 from which the output is obtained. As some of the sample pulse applied to the gate of transistor 51 may feed through to the source follower, the inverse of the sample pulse voltage is applied to the gate of the source follower 53 to cancel such feedthrough. After the transfer of charge from the $\phi_C$ storage sites to the $\phi_D$ storage sites, the voltages on the $\phi_D$ lines 24A and 24B due both to the transfer of charge and to the clock voltage fed through the interelectrode capacitances of the $\phi_C'$ electrodes with respect to the $\phi_D$ electrodes, decay through the resistances $R_1$ and $R_2$. Each of the above voltages may be several volts. Note that the difference in voltage on the lines 24A and 24B upon the transfer of charge into the $\phi_D$ electrodes is measured in the order of tenths of a volt. Preferably, the time constant of resistance $R_1$ times the capacitance of the line 24A and also the time of constant of resistance $R_2$ times the capacitance of the line 24B are short in relation to a cycle of transfer, i.e. the period of the clocking frequency, to assure resetting of the lines 24A and 24B to the $\phi_D$ voltage prior to transfer of another set of analog signal samples to the storage sites underlying the $\phi_D$ electrodes. However, this time constant should not be so short as to be comparable to the charge transfer interval and hence affect obtaining an accurate measure of the difference in charge induced on lines 24A and 24B. For accurate operation of the differential read out circuit the time constant of the capacitance of line 24A and resistance $R_1$ should be equal to the time constant of the capacitance of line 24B and resistance $R_1$. Actuation of the reset switch 45 at time $t_6$ after sampling has been accomplished causes the potential of terminal 41 to be fixed to the potential of the non-inverting terminal 42 by feedback action through the direct connection from the output terminal 43 to the inverting input 42 and also causes the feedback capacitance $C_{FB}$ to be completely discharged and readied for another sensing operation. Thus, in response to transfer of charge from the $\phi_C$ electrodes to the $\phi_D$ electrodes, the circuit responds at a fast rate to provide a change in level of output as terminal 43 which is an accurate measure of difference in charge induced on the lines 24A and 24B and thereafter the voltages on the lines 24A and 24B decay at a relatively slow rate to the voltage $\phi_D$ of source 46 before the next cycle of transfer of charge from the sites underlying the $\phi_C$ electrodes to the sites underlying the $\phi_D$ electrodes.

As the $\phi_D$ electrodes connected to lines 24A and 24B are capacitively coupled to the $\phi_C'$ electrodes, clocking voltage on the $\phi_C'$ electrodes feeds through to the lines 24A and 24B. The differential amplifier 40 rejects this common mode signal. As the signal varies, both the inverting terminal 41 and non-inverting terminal 42 vary by the same amount and in the same direction when the coupling capacitances to the lines 24A and 24B are identical. In the filter with a parallel shift register in accordance with the present invention the capacitance coupling from the $\phi_C'$ electrodes to line 24A is identical to the capacitive coupling from the $\phi_C'$ electrodes to the line 24B. Accordingly, the common mode signal is completely cancelled.

The differential readout circuit of FIG. 9 is described and claimed, including modifications, in a copending application Ser. No. 609,497 filed Sept. 2, 1975 filed concurrently here and assigned to the assignee of the present invention. The aforementioned application Ser. No. 609,497 is incorporated herein by reference thereto. Other different readout circuits suitable for providing readout in the filter of the present invention are described and claimed in copending application Ser. No. 609,496 also filed Sept. 2, 1975 and assigned to the assignee of the present invention. The aforementioned application Ser. No. 609,496 is incorporated herein by reference thereto.

While the filter of the present invention has been shown and described in one phase mode it is apparent that the filter may be operated in other modes, i.e. two or more phase modes.

While the filter of FIGS. 1 and 2 included transfer electrodes 28 in addition to the storage electrodes 24 and 26, it is readily apparent that the transfer electrodes 28 could be eliminated, if desired, and the electrodes 24 and 26 coupled sufficiently close together along the length thereof to provide a pair of either one phase or two phase shift registers to enable transfer of charge in the filter in accordance with the present invention. Also, it is apparent with the provision of an additional plurality of storage electrodes interleaved with the first and second pluralities of electrodes that a pair of three phase shift registers may be provided.

Whereas the first and second channels in the above embodiments of the invention are separated by means of a relatively thick region of the insulating silicon dioxide, other embodiments employing a region of more heavily doped substrate at the surface to separate the channels may also be used. Such more heavily doped regions are commonly referred to as channel stops.

It is also apparent that whereas the filter has been described in terms of a "p-channel" device, i.e. a device in which the stored charge is in the form of positive charge carriers or "holes", an "n-channel" device may be similarly constructed by methods well known to those skilled in the art. In the "n-channel" device the stored and transferred charge is in the form of negatively charged carriers or electrons. This necessitates operation of the device with potentials of the opposite sign.

While the principle of dynamic capacitive balance for charge transfer transversal filters has been applied and described in connection with surface charge transfer devices, the principle is equally applicable to other kinds of charge transfer devices.

While the invention has been described in specific embodiments it will be appreciated that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. A transversal filter comprising
   a substrate of semiconductor material including a first channel portion adjacent a major surface of said substrate and a second channel portion adjacent said major surface,
   a group of electrodes insulatingly overlying each of said channel portions,
   said group of electrodes forming with said substrate a portion of a first charge transfer shift register over said first channel portion and a portion of a second charge transfer shift register over said second channel portion,
   each of said electrodes having a split over said first channel portion dividing each of said electrodes over said first channel portion into a first part and a second part, the portion of each of said electrodes overlying said second channel portion constituting a third part thereof,
   a first conductive line connected to the first parts of said electrodes,
   a second conductive line connected to the second parts of said electrodes, the capacitance of the first parts of said electrodes being equal to the sum of the capacitances of the second and third parts of said electrodes.

2. The filter of claim 1 in which said first and second channel portions are of uniform width, the width of said second portion w being related to the sum of the widths of said first and second parts $w_c$ of said electrodes according to the following equation:

$$w = w_c \frac{\sum_{n=1}^{N} W_n}{N},$$

where $W_n$ is the normalized tap weight of the $n^{th}$ tap.

3. The filter of claim 1 in which said electrodes are uniformly spaced with respect to said major surface and in which the area of the first parts of said electrodes are equal to the sum of the areas of the second and third parts of said electrodes.

4. A transversal filter comprising,
a substrate of one conductivity type semiconductor material including a first channel portion of uniform width adjacent a major surface of said substrate and a second channel portion adjacent said major surface parallel to said first channel portion and of uniform width,
an insulator member overlying said major surface, and having uniform thickness over said first and second channel portions,
a group of serially arranged electrodes lying on said insulating member, overlying said channel portions and orthogonal to the length thereof, said electrodes being of uniform length measured along the length dimension of said channels,
said electrodes forming with said substrate a plurality of stages of a first charge coupled shift register over said first channel portion and a like plurality of stages of a second charge coupled shift register over said second channel portion, each stage of each of said shift registers including a like number of electrodes,
one electrode of each of said stages of said shift registers having a split along the length dimension thereof over said first channel portion to divide said one electrode over said first channel portion into a first part and a second part, the portion of said one electrode overlying said second channel portion constituting a third part thereof,
a first-conductive line connected to the first parts of said one electrodes,
a second conductive line connected to the second and third parts of said one electrodes,
the sum of the areas of the first parts of said one electrodes being equal to the sum of the areas of the second and third parts of said one electrodes.

5. The combination of claim 4 in which said group of electrodes are divided into a first and a second plurality, said first plurality consisting of said one electrodes of said stages, said second plurality including other electrodes of said group, each of said electrodes of said second plurality spaced between adjacent electrodes of said first plurality.

6. The combination of claim 4 in which said group of electrodes comprises
first, second and third pluralities of electrodes, said first plurality functioning to store and transfer charge and consisting of said one electrodes of said stages, said second plurality functioning to store and transfer charge, each of said electrodes of said second plurality spaced between adjacent electrodes of said first plurality, said third plurality functioning as charge transfer electrodes, each insulatingly overlying a respective adjacent pair of electrodes of said first and second pluralities.

7. The combination of claim 4 including
means for applying phase related voltages to each of the stages of each of said shift registers to effect transfer of charge from stage to stage of each of said shift registers, the same voltage being applied to said first and second lines,
means for applying a first bias charge of fixed level to said first shift register,
means for applying a second bias charge of said fixed level to said second shift register,
means for superimposing a charge level on said first bias level of said first shift register varying in accordance with successive samples of an analog signal,
differential sensing means connected between said first and second lines for detecting the difference in signal on said lines in response to the transfer of charge from stage to stage of each of said shift registers,
whereby an output signal representing the convolution of the tap weights of the stages of the shift register with the signal samples is obtained.

8. A charge transfer device comprising
a substrate of semiconductor material including a first channel portion adjacent a major surface of said substrate and a second channel portion adjacent said major surface,
a group of electrodes insulatingly overlying said channel portions and generally orthogonal to the length thereof,
said groups of electrodes forming with said substrate a portion of a first charge transfer shift register over said first channel portion and a portion of a second charge transfer shift register over said second channel portion,
at least one electrode of said group having a split along the length dimension thereof over said first channel portion dividing said one electrode over said first channel portion into a first part and a second part, the portion of said one electrode overlying said second channel portion constituting a third part thereof,
said one electrode being uniformly spaced over said first and second channel portions,
the area of the first part of said one electrode being equal to the sum of the areas of the second and third parts of said one electrode.

* * * * *